United States Patent
Yoshida et al.

(10) Patent No.: US 7,043,335 B2
(45) Date of Patent: May 9, 2006

(54) MAPPING DEVICE

(75) Inventors: Tetsuya Yoshida, Kakogawa (JP); Hirohiko Goto, Akashi (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 115 days.

(21) Appl. No.: 10/826,356

(22) Filed: Apr. 19, 2004

(65) Prior Publication Data

US 2004/0249507 A1  Dec. 9, 2004

(30) Foreign Application Priority Data

Apr. 21, 2003 (JP) ............... 2003-116071

(51) Int. Cl.
*G06F 19/00* (2006.01)
(52) U.S. Cl. ............... 700/195; 700/59; 700/60; 700/62; 700/70; 700/178; 700/192; 700/247; 702/516; 382/285; 359/470; 359/471; 346/286.14
(58) Field of Classification Search ............... 700/59, 700/60, 62, 64, 70, 160, 178, 190, 192, 195, 700/247, 259; 382/285; 702/516; 359/470, 359/471; 346/286.14
See application file for complete search history.

(56) References Cited

U.S. PATENT DOCUMENTS

| | | | |
|---|---|---|---|
| 4,769,523 A * | 9/1988 | Tanimoto et al. ...... | 219/121.6 |
| 4,770,590 A | 9/1988 | Hugues et al. | |
| 4,939,439 A * | 7/1990 | Dalglish ............... | 318/568.1 |
| 5,225,691 A | 7/1993 | Powers et al. | |
| 5,406,367 A * | 4/1995 | Sopori ............... | 356/30 |
| 5,418,382 A | 5/1995 | Blackwood et al. | |
| 5,783,834 A | 7/1998 | Shatas | |
| 6,053,983 A | 4/2000 | Saeki et al. | |
| 6,650,409 B1 * | 11/2003 | Noguchi et al. ...... | 356/237.3 |
| 6,876,438 B1 * | 4/2005 | Tokita ............... | 355/72 |
| 2005/0111727 A1 * | 5/2005 | Emery ............... | 382/145 |

FOREIGN PATENT DOCUMENTS

| | | |
|---|---|---|
| EP | 0 674 340 A1 | 9/1995 |
| EP | 001471565 A2 * | 10/2004 |
| JP | A-4-236448 | 8/1992 |
| JP | A-10-135306 | 5/1998 |
| JP | A-10-175734 | 6/1998 |
| JP | A-2000-036528 | 2/2000 |
| JP | A 2000-124289 | 4/2000 |
| WO | WO 99/02996 | 1/1999 |
| WO | A-11-163080 | 6/1999 |
| WO | WO 2004-001816 | 12/2003 |

* cited by examiner

*Primary Examiner*—Ramesh Patel
(74) *Attorney, Agent, or Firm*—Oliff & Berridge, PLC

(57) ABSTRACT

A regression mirror reflects light from a light projector in a reflecting direction opposite an incident direction. A light receiver combined with the light projector in a unitary unit receives the reflected light from the regression mirror. A detecting unit including an optical sensing unit having the light projector, the light receiver and the reflecting member is disposed so that a wafer is disposed in a moving path along which an optical path of the optical sensing unit moves relative to the wafer. An information-acquiring unit acquires position information of the detecting unit relative to the wafer, an arithmetic unit calculates mapping information about an arrangement of the wafer based on the position information and light-reception information provided by the light receiver.

11 Claims, 7 Drawing Sheets

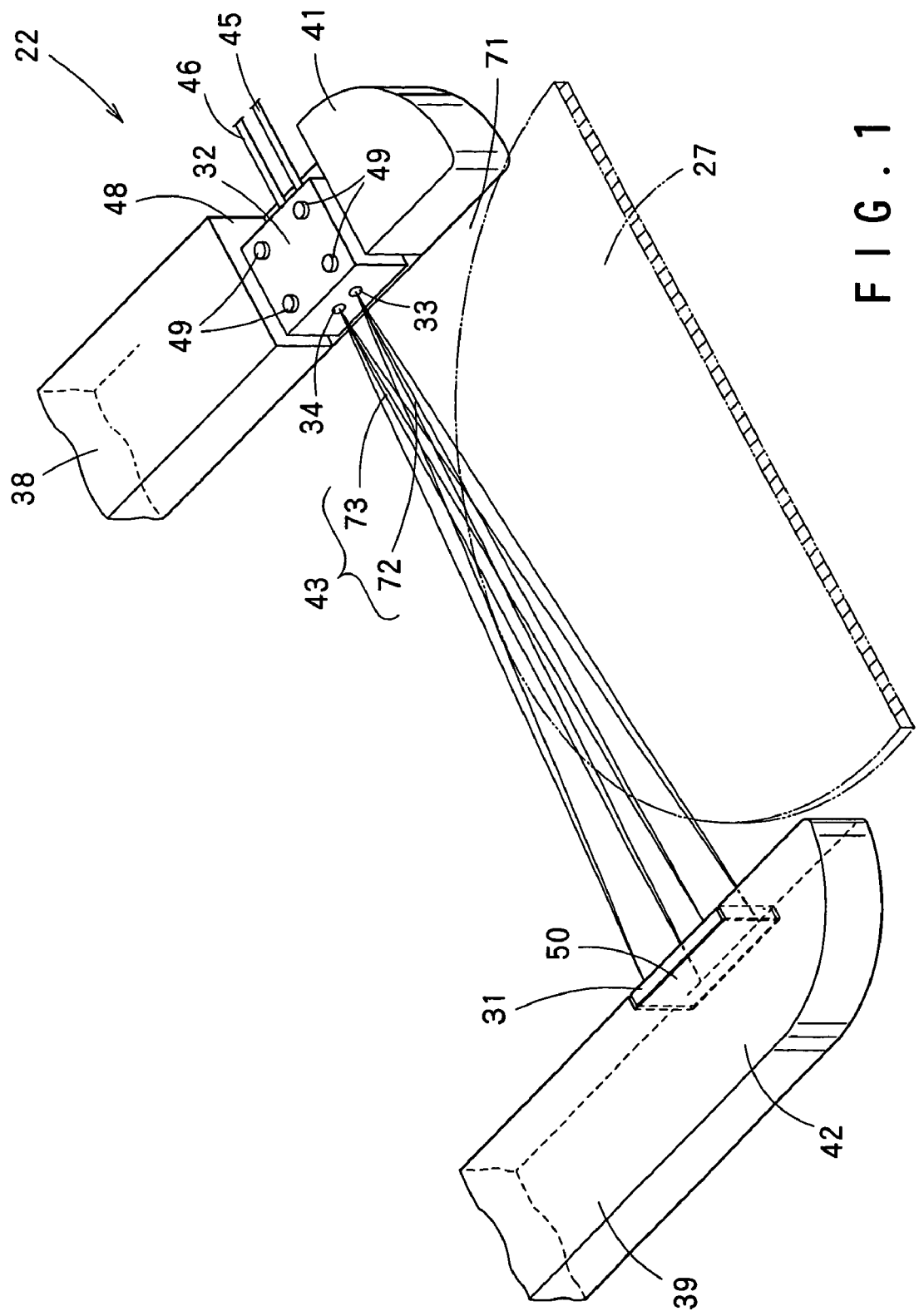
F I G. 1

MAPPING DEVICE

BACKGROUND OF THE INVENTION

1. Field of the Invention

The present invention relates to a mapping device for producing mapping information about the disposition of plate-shaped objects, such as semiconductor wafers (hereinafter referred to simply as "wafers").

2. Description of the Related Art

FIG. 10 is a front elevation of a transmission photoelectric sensor 1 included in a mapping device according to a first conventional technique. The mapping device produces mapping information about the disposition of wafers on the basis of detection information provided by a moving detecting unit, and position information about the position of the detecting unit. The transmission photoelectric sensor 1 is the detecting unit of the mapping device according to the first conventional technique.

The transmission photoelectric sensor 1 has a light projector 2 and a light receiver 3 spaced from the light projector 2. The light receiver 3 receives light projected by the light projector 2. A wafer 27 that passes a space between the light projector 2 and the light receiver 3 intercepts the light projected by the light projector 2 and hence the output of the light receiver 3 changes. The mapping device determines the position of the wafer 27 on the basis of the position of the detecting unit when the output of the light receiver 3 changes.

FIG. 11 shows a reflection photoelectric sensor 6 included in a mapping device according to a second conventional technique. The reflection photoelectric sensor 6 is the detecting unit of the mapping device according to the second conventional technique.

The reflection photoelectric sensor 6 has a reflecting mirror 7, and an optical sensing unit 8 disposed at a distance from the reflecting mirror 7 and including a light projector 9 and a light receiver 10. The light receiver 10 receives light projected by the light projector 8 and reflected by the reflecting mirror 7. The mapping device according to the second conventional technique, similarly to the mapping device according to the first conventional technique, determines the position of a wafer 27 on the basis of the position of the detecting unit when the output of the light receiver 10 changes.

As shown in FIG. 12, if the optical axis C1 of the light projector 2 (hereinafter referred to as "projection axis C1") and the optical axis C2 of the light receiver 3 (hereinafter referred to as "reception axis C2) are not aligned in the transmission photoelectric sensor 1 according to the first conventional technique, the transmission photoelectric sensor 1 is unable to achieve correct detection. Positional adjustment of the light projector 2 and the light receiver 3 to bring the optical axes C1 and C2 into alignment needs troublesome work.

When determining the position of a very thin, plate-shaped object, such as the wafer 27, the light projected by the light projector 2 needs to be small. Faulty detection will results unless the optical axes C1 and C2 are aligned in a high accuracy when the light projector 2 projects light in a small-diameter light beam. Therefore, the respective positions of the light projector 2 and the light receiver 3 must be accurately adjusted. Such an accurate positional adjustment needs troublesome work.

As shown in FIG. 13, if the axis C5 of reflected light reflected by the reflecting mirror 7 (hereinafter referred to as "reflection axis C5") is not aligned with the reception axis C4 of a light receiver 10 in the reflection photoelectric sensor 6 according to the second conventional technique, the transmission photoelectric sensor 6 is unable to achieve correct detection. Accurate positional adjustment of the reflecting mirror 7 and the optical sensing unit 8 to align the reflection axis C5 with the reception axis C4 needs troublesome work, similarly to the positional adjustment of the light projector 2 and the light receiver 3.

SUMMARY OF THE INVENTION

Accordingly, it is an object of the present invention to provide a mapping device including a detecting unit that facilitates positional adjustment thereof.

According to one aspect of the present invention, a mapping device comprises: a detecting unit including a reflecting member reflecting a projected light traveling in an incident direction in a reflecting direction opposite the incident direction, and an optical sensing unit including a light projector projecting a light onto the reflecting member and a light receiver receiving the light projected by the light projector and reflected by the reflecting member, the light projector and the light receiver being combined in a unitary unit, the detecting unit being configured to move relative to a plate-shaped object in a moving direction intersecting an optical path along which the light projected by the light projector travels to the light receiver so that the plate-shaped object lies in a moving region of the optical path; a position information acquiring means for acquiring a position information about a position of the plate-shaped object relative to the detecting unit; and an arithmetic means for calculating a mapping information about an arrangement of the plate-shaped object based on the position information provided by the position information acquiring means and a light-reception information provided by the light receiver.

As mentioned above, the detecting unit of the mapping device according to the present invention has the reflecting member and the optical sensing unit. The light projector projects light onto the reflecting member. The reflecting member reflects the light projected by the light projector. The light receiver receives the light projected by the light projector and reflected by the reflecting member.

In the present invention, the reflecting member reflects the incident light in the reflecting direction opposite to the incident direction. Thus, the light reflected by the reflecting member can be received by the light receiver only by projecting the light onto the reflecting member.

Therefore, even if the optical sensing unit is dislocated slightly from its correct position, the light projected by the light projector can be received by the light receiver only when the light projected by the light projector falls on the reflecting member. In other words, the light projected by the light projector can be made to be received by the light receiver simply by positioning the optical sensing unit so that the light projected by the light projector falls on the reflecting member. Thus, the projection axis of the light projector and the reception axis of the light receiver can be easily adjusted, and the positional adjustment of the detecting unit can be facilitated.

In the mapping device according to the present invention, it is preferable that the reflecting member is formed in the shape of a band.

The band-shaped reflecting member has a narrow width in a detecting direction in which the plate-shaped object is detected, and a long length parallel to a direction intersecting the detecting direction. Since the reflecting member has the narrow width in the detecting direction in which the plate-shaped object is detected, the difference between a quantity of light received by the light receiver when the light is not intercepted by the plate-shaped object and that of light received by the light receiver when the light bean is intercepted by the plate-shaped object is large. The light-intercepting range of the position of the plate-shaped object with respect to the detecting direction is narrowed to improve the accuracy of detecting the position of the plate-shaped object.

Although the area of a reflecting surface diminishes when the width of the reflecting member in the detecting direction is decreased, the reflecting surface having a long length in the direction intersecting the detecting direction is able to reflect the light projected by the light projector so that the light receiver receives a sufficient amount of light. Thus, the light receiver is able to receive a large amount of light sufficient for the light receiver to detect the unintercepted light.

Thus, the accuracy of determination of the position of the plate-shaped object can be improved and the light receiver is able to receive a sufficient amount of light. Consequently, the position of the plate-shaped object can be accurately determined.

In the mapping device according to the present invention, it is preferable that the light projected by the light projector is visible light.

When the light projector projects visible light, an operator engaged in adjusting work for adjusting the position of the optical sensing unit is able to recognize an illuminated area illuminated with the visible light projected by the light projector. Consequently, the operator is able to adjust the position of the optical sensing unit, while visually recognizing the illuminated area illuminated with the visible light projected by the light projector, which further facilitates the adjusting work.

In the mapping device according to the present invention, it is preferable that the light projected by the light projector is a linearly polarized light that oscillates in a predetermined first direction. The light received by the light receiver is a polarized light oscillating only in a predetermined second direction. The reflecting member receives an incident light oscillating in the first direction and reflects the incident light as a reflected light oscillating in the second direction.

As mentioned above, the light projector projects the linearly polarized light oscillating only in the first direction, and the reflecting member receives the linearly polarized light oscillating only in the first direction and reflects the same in the reflected linearly polarized light oscillating only in the second direction. The light receiver receives the linearly polarized light oscillating only in the second direction. Therefore, light receiver does not receive the light projected by the light projector and fallen thereon without being reflected by the reflecting member. The light projected by the light projector and fallen thereon without being reflected by the reflecting member is such light that is projected by the light projector and reflected by, for example, the plate-shaped object toward the light receiver. Since the light receiver is able to receive only the light projected by the light projector and reflected by the reflecting member, which prevents faulty detection of the plate-shaped objects.

According to another aspect of the present invention, a robot for carrying a plate-shaped object comprises: a hand configured to be moved together with the plate-shaped object; and the above-mentioned mapping device mounted on the hand.

Preferably, the robot further comprises hand position detecting means for obtaining a position information about the robot hand, wherein the position information acquiring means receives the position information about the hand from the hand position detecting means.

Preferably, the robot further comprises a drive motor configured to move the hand, wherein the hand position detecting means includes an encoder configured to detect a rotational state of the drive motor.

BRIEF DESCRIPTION OF THE DRAWINGS

The above and other objects, features and advantages of the present invention will become more apparent from the following description taken in connection with the accompanying drawings, in which:

FIG. 1 is a perspective view of a detecting unit included in a mapping device in a preferred embodiment according to the present invention;

DESCRIPTION OF THE PREFERRED EMBODIMENTS

Figure 2:
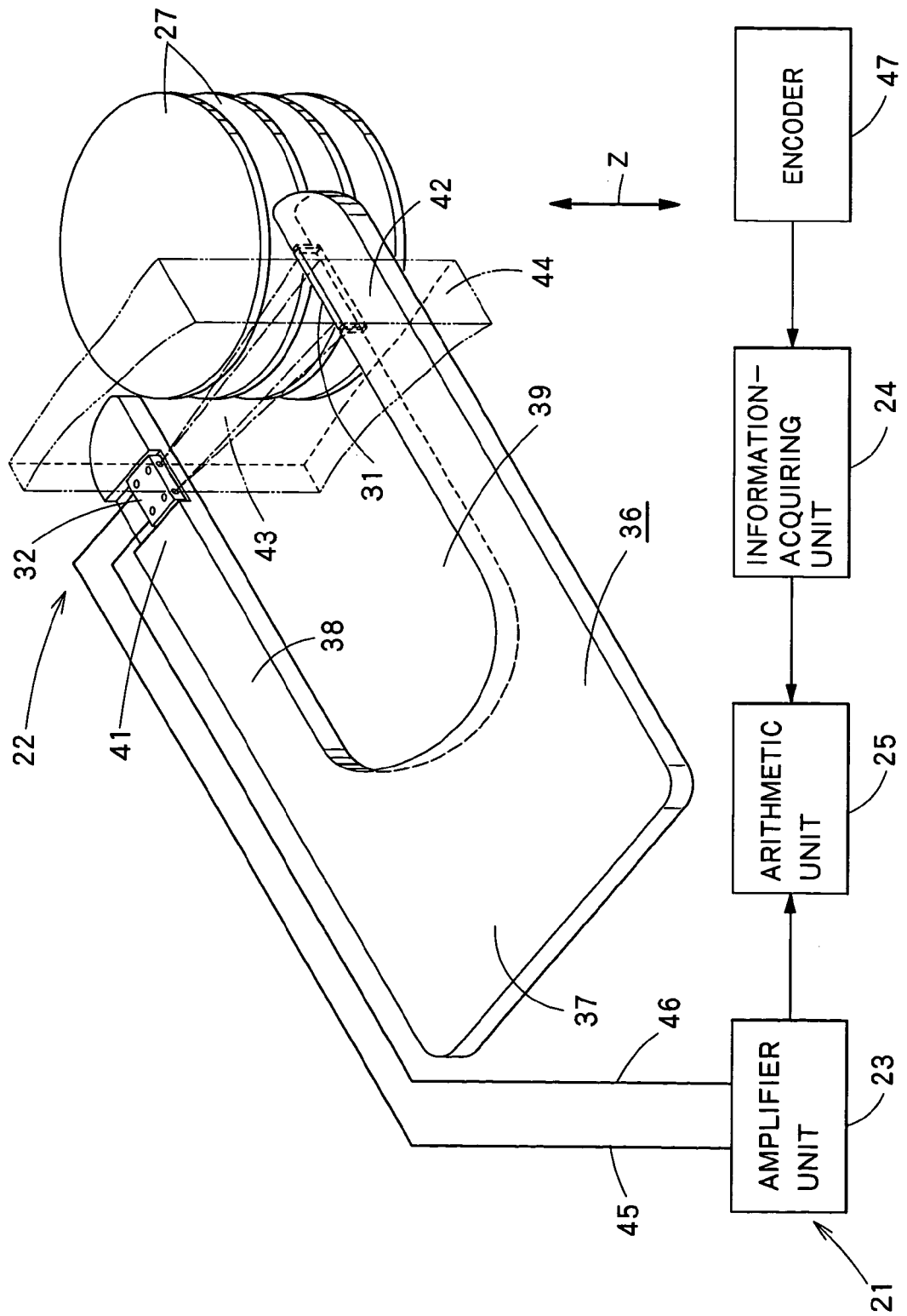
FIG. 2 is a block diagram of the mapping device in the preferred embodiment.

Referring to FIG. 1 showing a detection unit 22 included in a mapping device in a preferred embodiment according to the present invention in a perspective view and FIG. 2 showing the mapping device 21 in a block diagram, the mapping device 21 includes the detection unit 22, an amplifier unit 23, an information-acquiring unit 24 and an arithmetic unit 25. The mapping device 21 produces mapping information about the disposition of semiconductor wafers 27 arranged parallel to each other in Z directions. The wafers 27 are plate-shaped objects having a circular shape. The wafers 27 have, for example, a diameter of 200 mm or 300 mm, and a thickness of 0.7 mm.

Figure 5:
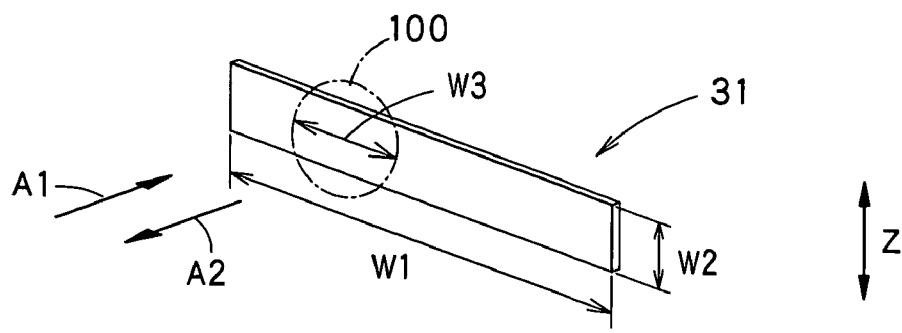
FIG. 5 is a schematic perspective view of a regression mirror.

The detection unit 22 includes a regression mirror 31 and an optical sensing unit 32. As shown in FIG. 5, the regression mirror 31 reflects projected light traveling in an incident direction A1 in a reflecting direction A2 opposite the incident direction A1. The incident direction A1 and the reflecting direction A2 are parallel or substantially parallel to each other and opposite directions.

The optical sensing unit 32 has a light projector 33 that projects light onto the regression mirror 31, and a light receiver 34 that receives the light projected by the light projector 33 and reflected by the regression mirror 31. The light projector 33 and the light receiver 34 of the optical sensing unit 32 are combined in a unitary unit.

Figure 3:
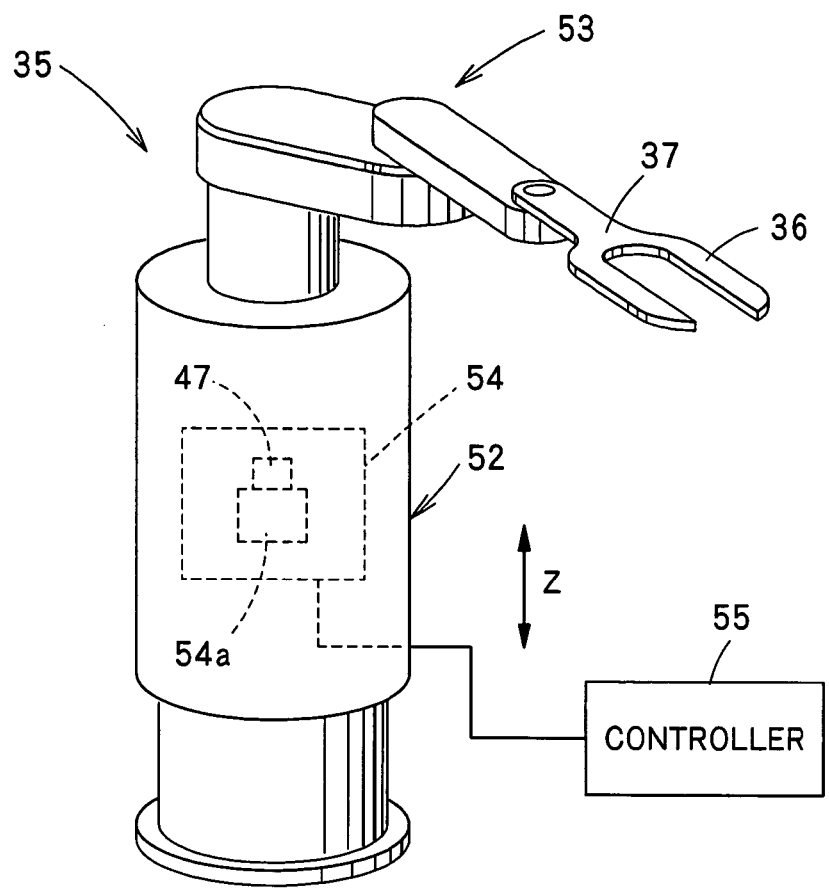
FIG. 3 is a perspective view of a carrier robot.

As shown in FIGS. 2 and 3, the detecting unit 22 is mounted on a robot hand 36 included in a carrier robot 35 for carrying the wafers 27. The robot hand 36 is formed, for example, in a substantially U-shape. The robot hand 36 has a base part 37, a first arm 38, and a second arm 39. The arms 38 and 39 extend from the base part 37. The optical sensing unit 32 is attached to an end pert 41 of the first arm 38. The regression mirror 31 is attached to an end part 42 of the second arm 39.

The robot hand 36 is movable in predetermined directions relative to the wafers 27. As shown in FIG. 1, a space 71 extends between the end part 41 of the first arm part 38 and the end part 42 of the second arm 39, i.e., between the regression mirror 31 and the optical sensing unit 32. Part of each of the wafers 27 crosses the space 71 when the robot hand 36 is moved in the moving direction. The moving directions of the robot arm 36 intersect an optical path 43 along which the light projected by the light projector 33 travels to the light receiver 34. The detecting unit 22 is moved in the moving directions parallel to the Z directions for a mapping operation. Therefore, the moving directions will be referred to as the moving directions Z. The Z directions are vertical directions parallel to a vertical Z-axis.

As the robot hand 36 moves in the moving direction Z relative to the wafers 27, the optical path 43 moves relative to the wafers 27. Therefore, as shown in FIG. 2, the wafers 27 are disposed such that parts of the wafers 27 is included in a moving region 44 in which the optical path 43 moves when the detecting unit 22 is moved for a mapping operation.

The amplifier unit 23 is connected optically to the optical sensing unit 32 with optical fibers 45 and 46. The amplifier unit 23 has a light-emitting device and a light-receiving device. Light emitted by the light-emitting device is guided to the light projector 33 of the optical sensing unit 32 by the optical fiber 45. Light received by the light receiver 34 is guided to the light-receiving device by the optical fiber 46. The light-emitting device emits, for example, red light, namely, visible light. The light-emitting device may be a red light-emitting diode that emits red light.

The amplifier unit 23 gives the arithmetic unit 25 an output signal representing received-light information provided by the light receiver 34. The output signal is a pulse signal that rises and falls according to the light-receiving condition of the light receiver 34.

The information-acquiring unit 24 acquires position information about the positions of the wafers 27 relative to the detecting unit 22 from an information producing means. In this embodiment, the information producing means is an encoder 47 held on a robot hand moving mechanism 54 including a drive motor 54a shown in FIG. 3 for moving the robot hand 36. The information-acquiring unit 24 receives data provided by the encoder 47 as position information. The position information indicates the position of the robot hand 36 moved by the robot hand moving mechanism 54.

The arithmetic unit 25 calculates mapping information about the disposition of the wafers 27 arranged along the Z axis on the basis of the position information acquired by the information-acquiring unit 24 and the light reception information provided by the light receiver 34 and given to the amplifier unit 23. The amplifier unit 23, the information-acquiring unit 24 and the arithmetic unit 25 are separated from the robot hand 36 and are fixedly installed at a predetermined position.

As shown in FIG. 1, the optical sensing unit 32 is mounted on the end part 41 of the first arm 38 opposite to the second arm 39. The regression mirror 31 is mounted on the end part 42 of the second arm 39 opposite to the first arm 38.

Figure 4:
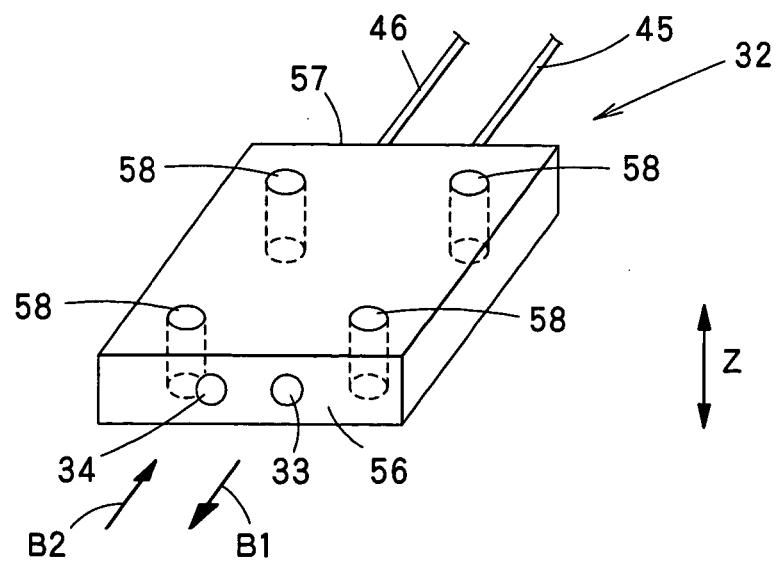
FIG. 4 is an enlarged perspective view of an optical sensing unit included in the mapping device in the present embodiment.

The end part 41 of the first arm 38 is provided with a recess 48. The bottom of the recess 48 is provided with, for example, four threaded holes. The optical sensing unit 32 is provided with, for example four through holes 58 extending along the thickness thereof as shown in FIG. 4. When the optical sensing unit 32 is positioned in place in the recess 48, the through holes 58 are substantially coaxial with the threaded holes formed in the bottom of the recess 48. The through holes 58 have a diameter greater than the inside diameter of the threaded holes. Screws 49 are passed through the through holes 58 of the optical sensing unit 32 and are screwed in the threaded holes of the first arm 38 to fasten the optical sensing unit 32 placed in the recess 48 detachably to end part 41 of the first arm 38. The position of the optical sensing unit 32 on the end part 41 of the first arm is adjustable.

In the state where the optical sensing unit 32 is fastened to the first arm 38, the light projector 33 and the light receiver 34 are arranged side by side in a horizontal direction perpendicular to the vertical direction parallel to the Z-axis. The light projector 33 is nearer to the extremity of the first arm 38 than the light receiver 34, and is nearer to the wafers 27 than the light receiver 34 during the mapping operation.

A recess 50 conforming to the shape of the regression mirror 31 is formed in the end part 42 of the second arm 39, and the regression mirror 31 is fitted in the recess 50. The regression mirror 31 is bonded to the second arm 39 with, for example, an adhesive. The regression mirror 31 has an elongate, rectangular shape, namely, a band shape. The short sides of the regression mirror 31 parallel to the width of the regression mirror which is parallel to the vertical direction Z parallel to the detecting direction. In the mapping operation, the width of the regression mirror 31 is parallel to the thickness of the wafers 27. The long sides of the regression mirror 31 extend in parallel to a direction intersecting the detecting direction. Preferably, the long sides of the regression mirror 31 are parallel to a direction from the light projector 33 toward the light receiver 34.

As mentioned above, the space 71 extends between the end part 41 of the first arm part 38 and the end part 42 of the second arm 39, i.e., between the regression mirror 31 and the optical sensing unit 32. When none of the wafers 27 is in the space 71, i.e., when none of the wafers 27 lies between the regression mirror 31 and the optical sensing unit 32, the light projected by the light projector 32 is reflected by the regression mirror 31 and falls on the light receiver 34. When the wafer 27 lies in the space 71, i.e., when the wafer 27 lies between the regression mirror 31 and the optical sensing unit 32, the light projected by the light projector 33 is intercepted by the wafer 27 and is unable to fall on the light receiver 34.

Referring to FIG. 3 showing the carrier robot 35 in a perspective view, the carrier robot 35 includes a vertical drive unit 52 and a horizontal drive unit 53. The vertical drive unit 52 has the robot hand moving mechanism 54. The horizontal drive unit 53 is connected to the vertical drive unit 52. The base part 37 of the robot hand 36 for transferring the wafers 27 is connected to the horizontal drive unit 53, and the horizontal drive unit moves the robot hand 36 horizontally. The vertical drive unit 52 and the horizontal drive unit 53 are controlled by a controller 55. The drive motor 54a in the vertical drive unit 52 vertically moves the robot hand 36. The encoder 47 is combined with the output shaft of the drive motor 54a to measure the angle of rotation of the output shaft of the drive motor 54a. The position of the robot hand 36 is determined on the basis of data provided by the encoder 47.

The carrier robot 35 determines the number of wafers 27 contained in a first wafer carrier and decides whether or not any wafers 27 are contained in the first wafer container on the basis of mapping information provided by the mapping device 21. The carrier robot 35 holds the wafers 27 efficiently according to the mapping information, and transfers the wafers 27 to a second wafer carrier. The carrier robot 35 is included in a semiconductor device fabricating system. The carrier robot 35 carries wafers 27 between a wafer carrier held on the side of a processing unit and a wafer carrier held on the side of a delivery unit. The wafer carrier held on the side of the processing unit contains wafers 27 to be subjected to a predetermined process. The wafer carrier held on the side of the delivery unit contains wafers 27 to be subjected to a predetermined process or processed wafers 27.

Referring to FIG. 4 showing the optical sensing unit 32 in an enlarged perspective view, the optical sensing unit 32 has a shape substantially resembling a rectangular solid. The light projector 33 and the light receiver 34 are disposed close to each other in a central part of one side surface of the optical sensing unit 32. The optical fibers 45 and 46 respectively connected to the light projector 33 and the light receiver 34 extend outward from a side surface 57 of the optical sensing unit 32 opposite the side surface 56. The light projector 33 and the light receiver 34 face the same direction.

A light-projecting direction B1 in which the light projector 33 projects light and a light-receiving direction B2 from which the light receiver 34 receives the light are parallel or substantially parallel to each other and are opposite directions.

The four through holes 58 of the optical sensing unit 32 are extend through four corners of the optical sensing unit 32 along the thickness of the optical sensing unit 32. The diameter of the through holes 58 is greater than the body diameter of the screws 49 and hence a clearance is formed between the side walls of the through holes 58 and the bodies of the screws 49 inserted in the through holes 58. Thus, the position of the optical sensing unit 32 in the recess 48 is adjustable.

The position of the optical sensing unit 32 on the robot hand 36 is adjusted, and the screws 49 are passed through the through holes 58 and screwed in the threaded holes of the robot hand 36. Thus, the optical sensing unit 32 is held firmly between the heads of the screws 49 and the robot hand 36.

Figure 6:
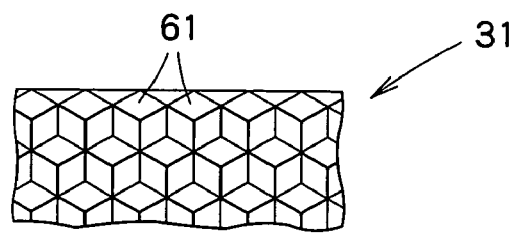
FIG. 6 is an enlarged, partial front elevation of the regression mirror shown in FIG. 5.

FIG. 5 is a schematic perspective view of the regression mirror 31 and FIG. 6 is an enlarged partial front elevation of the regression mirror 31. The regression mirror 31 has a plurality of corner cubes 61 having the shape of a tetrahedron. Each corner cube 61 has one transparent surface, and three reflecting surfaces perpendicularly intersecting each other. Incoming light fallen on the transparent surface is reflected by the reflecting surfaces and outgoing light leaves the corner cube 61 through the transparent surface. The corner cubes 61 are arranged contiguously as shown in FIG. 6 with their transparent surfaces included in an imaginary plane. As mentioned above, the regression mirror 31 reflects incoming light traveling in the incident direction A1 in the reflecting direction A2 opposite the incident direction A1.

The regression mirror 31 has the shape of a band. The regression mirror 31 is disposed so that at least a part of an illuminated region 100 illuminated with light projected by the light projector 33 is included in the regression mirror 31. The optical sensing unit 32 is disposed so that the light projected by the light projector 33 falls on the regression mirror 31. The length W1, namely, the size of the long sides, of the regression mirror 31 is greater than the longitudinally size W3 of the illuminated region 100. Thus, the light projected by the light projector 33 can be reflected by the regression mirror 31 even if the optical sensing unit 23 is dislocated slightly from its correct position. The amount of light that can be received by the light receiver 34 when the length W1 of the regression mirror 31 is longer than the longitudinal size W3 of the illuminated region 100 is greater than that of light received by the light receiver 34 when the length W1 of the regression mirror 31 is shorter than the longitudinal size W3 of the illuminated region 100.

The width of the regression mirror 31, namely, the size along the vertical direction Z, is small, which improves the accuracy of detection. For example, length W1 of the regression mirror 31 is in the range of 20 to 30 mm, and the width W2 of the same is 2 mm.

Figure 7:
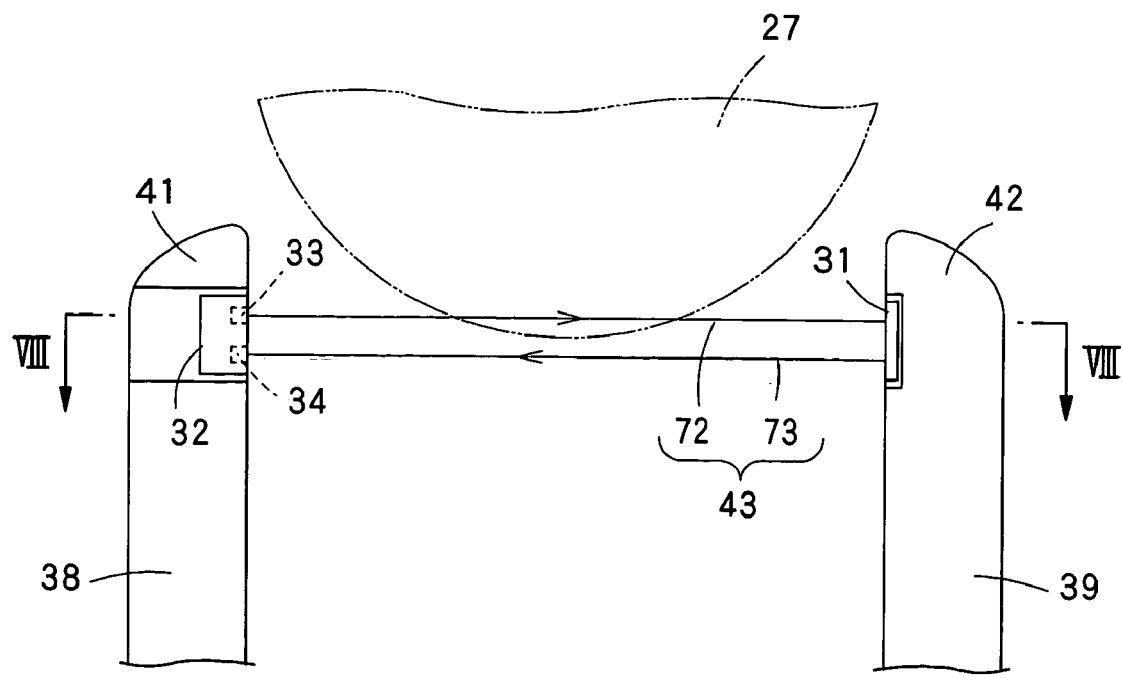
FIG. 7 is an enlarged view of end parts of the arms of a hand.

FIG. 7 shows the respective end parts 41 and 42 of the arms 38 and 39 of the robot hand 36 in an enlarged plan view. Actually, a first optical path 72 from the light projector 33 to the regression mirror 31, and a second optical path 73 from the regression mirror 31 to the light receiver 34 extend close to each other. In FIG. 7, the optical paths 72 and 73 are spaced apart typically to facilitate understanding the illustration. As shown in FIG. 1, the light projector 33 is nearer to the extremity of the first arm 38 than the light receiver 34. During the mapping operation, the wafers 27 are arranged in the moving region of the first optical path between the light projector 33 and the regression mirror 31 in the optical path 43. Thus, mapping information can be satisfactorily produced.

Figure 8A:
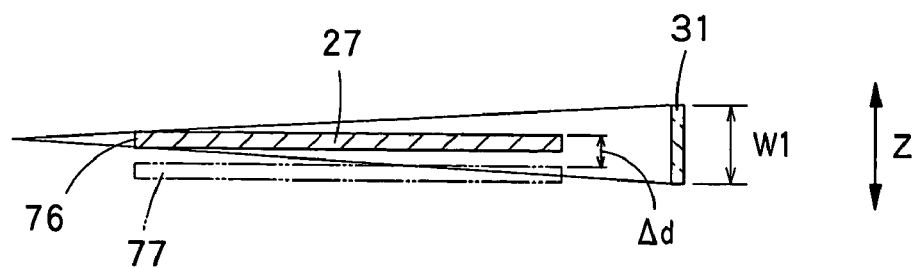
FIG. 8A is a sectional view taken on the line VIII—VIII in FIG. 7
Figure 8B:
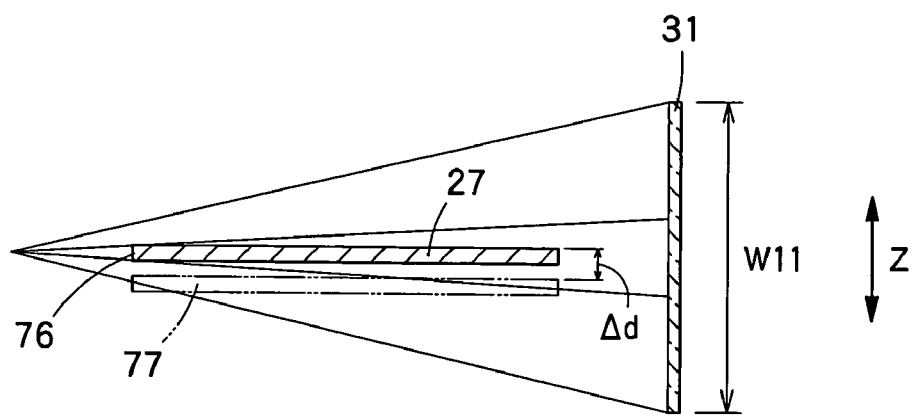
FIG. 8B is another sectional view at the same portion for comparison.

FIG. 8A shows the regression mirror 31 having a first width W1, and FIG. 8B shows a regression mirror 31 in a comparative example having a second width W11 greater than the first width W1. In FIGS. 8A and 8B, the wafer 27 lies between the light projector 32 and the regression mirror 31; that is, the wafer 27 lies on the first optical path 72.

When the detecting unit 22 is moved in the vertical direction Z for mapping, the area of an illuminated region on the regression mirror 31 illuminated with the light projected by the light projector 33 varies according to the position of the wafer 27 relative to the first optical path 72. Consequently, the amount of reflected light reflected by the regression mirror 31 and received by the light receiver 34 varies accordingly.

When the regression mirror 31 has the second width W11 greater than the first width W1, the light projected by the light projector 33 and reflected by the regression mirror 31 falls on the light receiver 34 even if the wafer 27 lies between the light projector 33 and the regression mirror 31. Therefore, the difference in the quantity of light received by the light receiver 34 between a state where the wafer 27 exists between the light projector 33 and the regression mirror 31 and a state where any wafer does not exist between the light projector 33 and the regression mirror 31 is small.

Therefore, it is difficult to decide whether or not any wafer 27 exists between the light projector 33 and the regression mirror 31.

Referring to FIGS. 8A and 8B, when the regression mirror 31 has the second width W11 greater than the first width W1, the difference in the area of the illuminated region on the regression mirror 31 between a state where the wafer 27 lies at a first position 76 corresponding to the light projector 33 with respect to the vertical direction Z, and a state where the wafer 27 lies at a second position 77 dislocated vertically by a small distance Δd from the first position 76 is small as can be seen from FIG. 8B. Thereby, the difference in the quantity of light received by the light receiver 34 between those states is small. Consequently, the state where the wafer 27 lies at the first position 76 and the state where the wafer 27 is at the second position 77 cannot be discriminated from each other.

In this embodiment, the regression mirror 31 is formed in the first width W1 in consideration of the foregoing problem. When the regression mirror 31 is formed in the first width W1, the possibility that the light projected by the light projector 33 and reflected by the regression mirror 31 is received by the light receiver 34 even in a state where the wafer 27 exits between the light projector 33 and the regression mirror 3 can be reduced to the least possible extent. Consequently, the difference in the quality of light received by the light receiver 34 between the state where the wafer 27 exists between the light projector 33 and the regression mirror 31 and the state where the wafer 27 does not exist between the light projector 33 and the regression mirror 31 is large. Thereby, it is possible to decide accurately whether or not the wafer 27 exists between the light projector 33 and the regression mirror 31.

When the regression mirror 31 is formed in the first width W1, the difference in the area of an illuminated region on the regression mirror 31 between a state where the wafer 27 is at the first position 76 and a state where the wafer 27 is at the second position 77 is large. Thereby, the difference in the amount of light received by the light receiver 34 is large. Consequently, the state where the wafer 27 is at the first position 76 and the state where the wafer 27 is at the second position 77 can be discriminated from each other. Thus, the position of the wafer 27 with respect to the vertical direction Z can be accurately determined and accurate mapping information can be produced.

Figure 9:
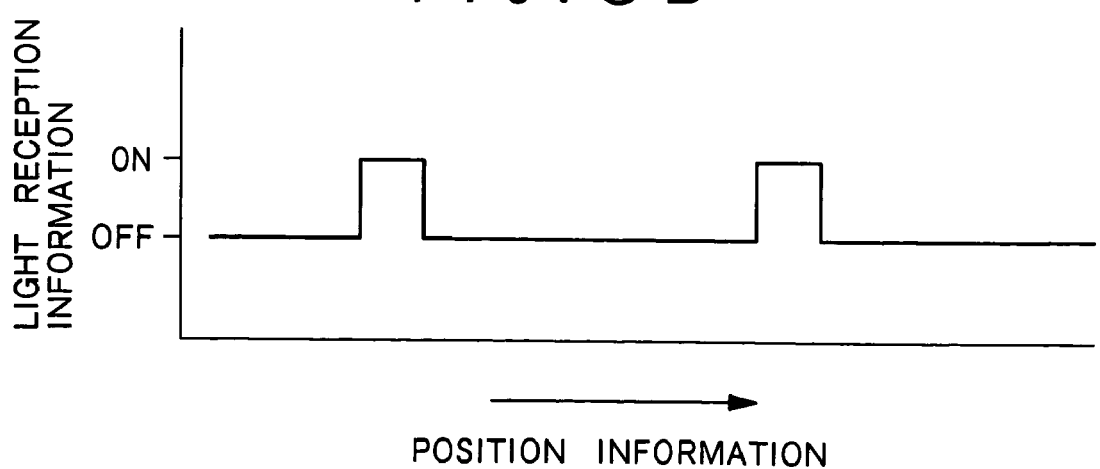
FIG. 9 is a diagram showing the relation between the position of the detecting unit and information provided by a light receiver.
Figure 10:
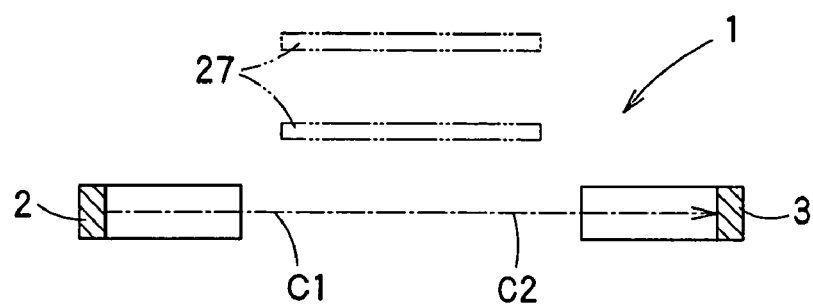
FIG. 10 is a front elevation of a transmission photoelectric sensor included in a mapping device according to a first conventional technique.
Figure 11:
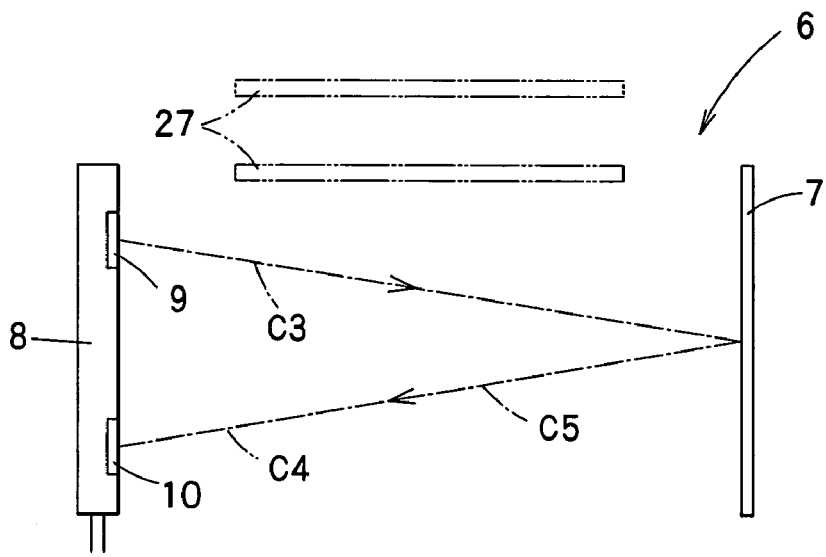
FIG. 11 is a front elevation of a reflection photoelectric sensor included in a mapping device according to a second conventional technique.
Figure 12:
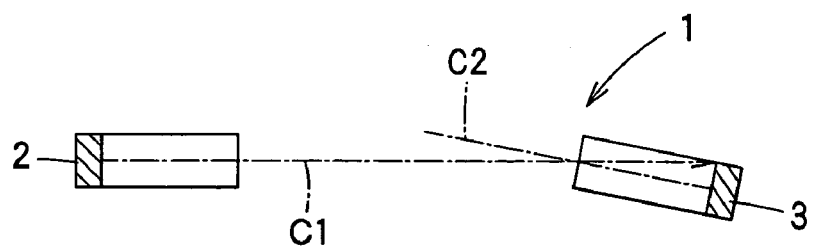
FIG. 12 is a front elevation of the transmission photoelectric sensor shown in FIG. 10, in which the light projection axis of a light projector and the light reception axis of a light receiver are not aligned.
Figure 13:
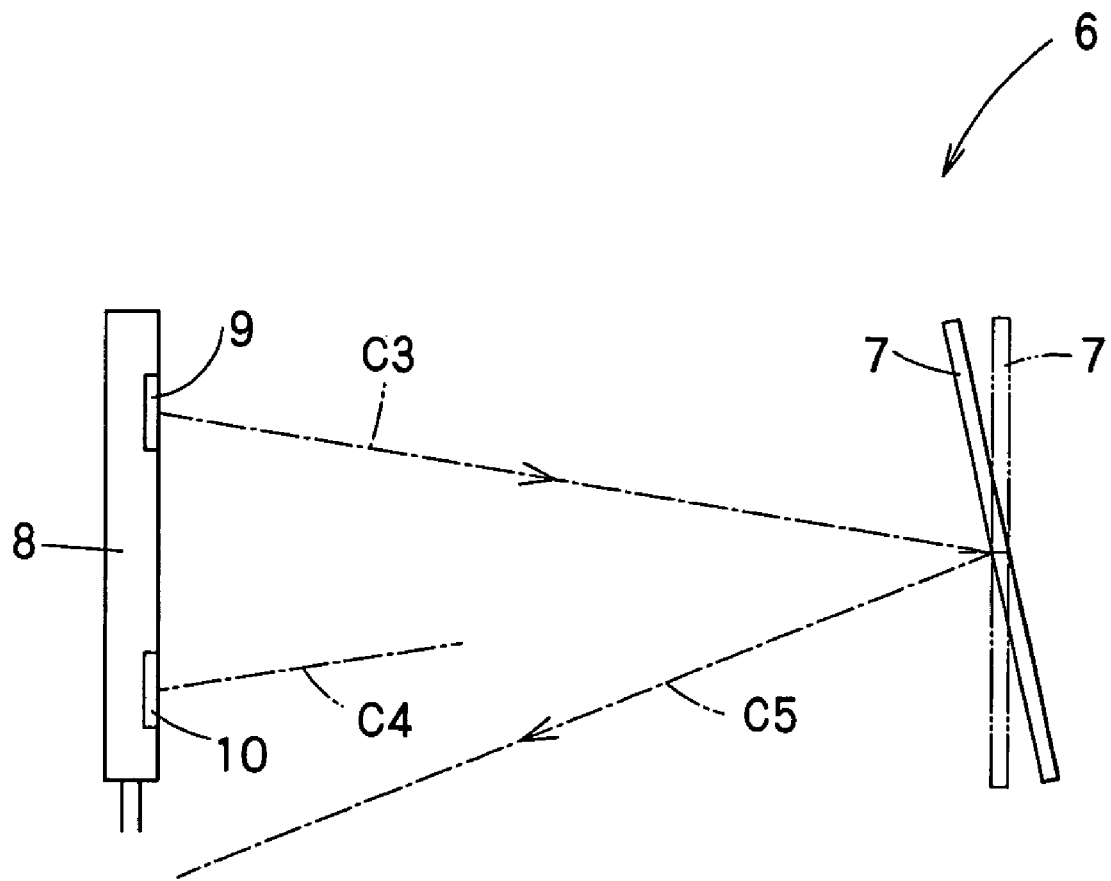
FIG. 13 is a front elevation of the reflection photoelectric sensor shown in FIG. 11, in which the light reflection axis of a light reflector and the light reception axis of a light receiver are not aligned.

FIG. 9 is a graph showing the position of the detecting unit 22 and light reception information provided by the light receiver 34, in which position information about the position of the detecting unit 22 is measured on the horizontal axis, and light reception information provided by the light receiver 34 is measured on the vertical axis. The level of the light reception information is OFF (LOW) when the amount of light received by the light receiver 34 is greater than a predetermined threshold, and is ON (HIGH) when the same is smaller than the threshold. In an intercepting state where the light projected by the light projector 33 is intercepted by the wafer partly lying in the space 71, the light reception information is ON (HIGH). In an unintercepting state where any wafer 27 does not lie in the space 71 and the light projected by the light projector 33 is not intercepted, the light reception information is OFF (LOW).

As the detecting unit 22 is moved in the vertical direction Z, the encoder 47 of the carrier robot 35 measures the position of the detecting unit 22 and provides position information about the position of the detecting unit 22 with respect to the vertical direction Z, and the detecting unit 22 and the amplifier unit 23 produce light reception information. As the robot hand 36 is moved in the vertical direction Z, the intercepting state and the unintercepting state are repeated according to the arrangement of the wafers 27.

The arithmetic unit 25 calculates mapping information about the arrangement of the wafers 27 arranged in the vertical direction Z on the basis of the position information acquired by the information-acquiring unit 24 and the light-reception information obtained by the light receiver 34 and provided by the amplifier unit 23. The arrangement of the wafers 27 with respect to the vertical direction Z can be determined by comparing the position information and the light reception information.

In this embodiment, the light projector 33 and the light receiver 34 of the optical sensing unit 32 are combined in a unitary unit, and the regression mirror 31 reflects projected light traveling in the incident direction A1 in the reflecting direction A2 opposite the incident direction A1. Thus, the light projector 33 needs only to project light so that the light falls on the regression mirror 31 to make the light projected by the light projector 33 to be reflected by the regression mirror 31 and to be received by the light receiver 34.

Therefore, the light projected by the light projector 33 can be reflected by the regression mirror 31 and can be received by the light receiver 34 only by positioning the optical sensing unit 32 so that the light projected by the light projector 33 may fall on the regression mirror 31. Thus, the regression mirror 31 doe not need to be positioned in a high positioning accuracy. Even if the optical sensing unit 32 is dislocated slightly from its accurate position, the mapping operation can be satisfactorily achieved provided that the light projected by the light projector 33 falls on the regression mirror 31. The respective optical axes of the light projector 33 and the light receiver 34, as compared with those of the conventional mapping device, can be easily aligned with correct directions and the position of the detecting unit 22 can be easily adjusted.

Since the highly accurate positioning of one of two parts disposed apart from each other is unnecessary, time necessary for adjusting work can be curtailed, and even an operator who is not highly skilled can satisfactorily achieve the adjusting work. Since the regression mirror 31 does not need to be highly accurately positioned, any precision mounting members finished in a high machining accuracy are not necessary to mount the regression mirror 31 on the second arm 39 and thereby the cost of mounting members can be reduced.

Since the width of the regression mirror 31 parallel to the thickness of the wafer 27 is small, the difference in the amount of light received by the light receiver 34 between the intersecting state where the light is intercepted by the wafer 27, and the unintercepting state where the light is not intercepted is large. Thereby, the position of the wafer 27 can be determined in a high accuracy.

Although the decrease of the width of the regression mirror 31 decreases the area of the reflecting surface of the regression mirror 31, the regression mirror 31 has the reflecting surface of a sufficiently large area because the regression mirror 31 has a big length. The light projected by the light projector 33 diverges toward the regression mirror 31. The regression mirror 31 reflects the projected light traveling in the incident direction A1 in the reflecting direction A2 opposite the incident direction A1. Thus, the light reflected by the regression mirror 31 converges toward the light receiver 34. Consequently, the light receiver 34 is able to receive a large amount of light.

Since the light receiver 34 is able to receive a large amount of light, the influence error caused by, for example, disturbing light is insignificant and hence the position of the wafer 27 can be determined in a high accuracy. Since the light receiver 34 is able to receive a large amount of light, the light receiver 34 is able to receive a sufficient amount of light necessary for determining the unintercepting state.

Since the position of the wafer 27 can be determined in a high accuracy and the light receiver 34 is able to receive a sufficient amount of light, the position of the wafer 27 can be accurately determined.

Since the light projector 33 in this embodiment project red light, an operator engaged in adjusting work for adjusting the position of the optical sensing unit 32 is able to recognize visually the illuminated region 100 illuminated with the red light projected by the light projector 33. Consequently, the operator is able to adjust the position of the optical sensing unit 32, while visually recognizing the illuminated area 100 illuminated with the red light projected by the light projector 33, which further facilitates the adjusting work.

The foregoing embodiment of the present invention is only an example and not limitative, and various changes may be made therein without departing from the scope of the present invention. For example, the plate-shaped objects may be of any type, such as glass substrates, other than the wafers 27. The mapping device of the present invention is suitable for determining positions of thin objects having a very small thickness, such as the wafers 27.

The detecting unit 22 may be mounted on something other than the robot hand 36. The light projector 33 may project any suitable visible light other than the red light or may project a radiation other than visible light. The reflecting member may be a prism instead of the regression mirror 31. The reflecting member may be any reflector provided that the reflector has the so-called regressive property, i.e., a property to reflect light traveling in the incident direction A1 in the reflecting direction A2 opposite the incident direction A1. The reflecting member does not need to be regressive in all directions. Even if the reflecting member has a regressive property in limited directions, the positional adjustment of the optical sensing unit 32 with respect to the limited directions can be facilitated.

Although the information-acquiring unit 24 included in this embodiment acquires position information about the positions of the wafers 27 relative to the detecting unit 22 from the encoder 47 of the carrier robot 35, the information-acquiring unit 24 itself may be a displacement sensor. For example, the information-acquiring unit 24 may determine the position of the robot hand 36 relative to the wafer 27 to obtain position information. A wafer carrier containing the wafers 27 may be moved relative to the detecting unit 22.

In a modification of the embodiment of the present invention, the light projector may project linearly polarized light that oscillates in a predetermined first direction, and the light receiver may receive only polarized light oscillating only in a predetermined second direction. In such a case, the light projector and the light receiver are provided with polarization filters, respectively. The respective directions of polarization of the polarization filters are perpendicular to each other, and hence the first and the second direction are perpendicular to each other. The regression mirror of the modification may be the same as the regression mirror 31 of the foregoing embodiment. The regression mirror turns the plane of oscillation of the incident light oscillating in the first direction through an angle of 90° to reflect reflected light oscillating in the second direction. Thus, the light receiver receives only the light projected by the light projector and hence the S/N ratio can be improved and faulty position determination can be avoided.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A mapping device comprising:
   a detecting unit including a reflecting member reflecting a projected light traveling in an incident direction in a reflecting direction opposite the incident direction, and an optical sensing unit including a light projector projecting a light onto the reflecting member and a light receiver receiving the light projected by the light projector and reflected by the reflecting member, the light projector and the light receiver being combined in a unitary unit, the detecting unit being configured to move relative to a plate-shaped object in a moving direction intersecting an optical path along which the light projected by the light projector travels to the light receiver so that the plate-shaped object lies in a moving region of the optical path;
   a position information acquiring means for acquiring a position information about a position of the plate-shaped object relative to the detecting unit; and
   an arithmetic means for calculating a mapping information about an arrangement of the plate-shaped object based on the position information provided by the position information acquiring means and a light-reception information provided by the light receiver.

2. The mapping device according to claim 1, wherein the reflecting member is formed in a shape of a band.

3. The mapping device according to claim 2, wherein the light projected by the light projector is a visible light.

4. The mapping device according to claim 3, wherein the light projected by the light projector is a linearly polarized light that oscillates in a predetermined first direction,
   the light received by the light receiver is a polarized light oscillating only in a predetermined second direction, and
   the reflecting member receives an incident light oscillating in the first direction and reflects the incident light as a reflected light oscillating in the second direction.

5. The mapping device according to claim 2, wherein the light projected by the light projector is a linearly polarized light that oscillates in a predetermined first direction,
   the light received by the light receiver is a polarized light oscillating only in a predetermined second direction, and
   the reflecting member receives an incident light oscillating in the first direction and reflects the incident light as a reflected light oscillating in the second direction.

6. The mapping device according to claim 1, wherein the light projected by the light projector is a visible light.

7. The mapping device according to claim 3, wherein the light projected by the light projector is a linearly polarized light that oscillates in a predetermined first direction,
   the light received by the light receiver is a polarized light oscillating only in a predetermined second direction, and
   the reflecting member receives an incident light oscillating in the first direction and reflects the incident light as a reflected light oscillating in the second direction.

8. The mapping device according to claim 1, wherein the light projected by the light projector is a linearly polarized light that oscillates in a predetermined first direction,
   the light received by the light receiver is a polarized light oscillating only in a predetermined second direction, and the reflecting member receives an incident light oscillating in the first direction and reflects the incident light as a reflected light oscillating in the second direction.

9. A robot for carrying a plate-shaped object comprising:
a hand configured to be moved together with the plate-shaped object; and
a mapping device according to claim 1 mounted on the hand.

10. The robot according to claim 9, further comprising hand position detecting means for obtaining a position information about the robot hand, wherein the position information acquiring means receives the position information about the hand from the hand position detecting means.

11. The robot according to claim 10, further comprising a drive motor configured to move the hand, wherein the hand position detecting means includes an encoder configured to detect a rotational state of the drive motor.

* * * * *